US012615993B2

(12) United States Patent
Lee

(10) Patent No.: US 12,615,993 B2
(45) Date of Patent: Apr. 28, 2026

(54) STOCKER SYSTEM HAVING ACTIVE SHELF MODULE AND CONTROL METHOD THEREOF

(71) Applicant: SEMES CO., LTD., Cheonan-si (KR)

(72) Inventor: Seul Lee, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 413 days.

(21) Appl. No.: 18/221,805

(22) Filed: Jul. 13, 2023

(65) Prior Publication Data

US 2024/0017919 A1 Jan. 18, 2024

(30) Foreign Application Priority Data

Jul. 15, 2022 (KR) ........................ 10-2022-0087456

(51) Int. Cl.
*H10P 72/30* (2026.01)
(52) U.S. Cl.
CPC .................................... *H10P 72/30* (2026.01)
(58) Field of Classification Search
CPC ........... H01L 21/6773; H01L 21/67736; H01L 21/67769; H01L 21/67775; H01L 21/677
See application file for complete search history.

(56) References Cited

U.S. PATENT DOCUMENTS

| | | | | |
|---|---|---|---|---|
| 2010/0003111 A1* | 1/2010 | Yeo | .................... | H01L 21/67769 |
| | | | | 414/222.07 |
| 2010/0047045 A1* | 2/2010 | Park | .................. | H01L 21/67769 |
| | | | | 414/222.07 |
| 2010/0290872 A1* | 11/2010 | Bonora | ............. | H01L 21/67769 |
| | | | | 257/E21.001 |
| 2014/0140794 A1* | 5/2014 | Adachi | ............. | H01L 21/67769 |
| | | | | 254/113 |
| 2014/0286733 A1* | 9/2014 | Ogura | ............... | H01L 21/67769 |
| | | | | 414/217.1 |
| 2016/0336209 A1* | 11/2016 | Yoshioka | .......... | H01L 21/67736 |
| 2018/0047591 A1* | 2/2018 | Ogo | ........................ | H01L 21/68 |
| 2020/0105561 A1* | 4/2020 | Yoon | ................. | H01L 21/67775 |
| 2021/0134636 A1* | 5/2021 | Teramoto | .......... | H01L 21/67775 |
| 2021/0331866 A1* | 10/2021 | Morimoto | ........... | B65G 1/0464 |
| 2023/0138966 A1* | 5/2023 | Yoshimoto | .............. | B65G 1/06 |
| | | | | 414/277 |
| 2024/0317492 A1* | 9/2024 | Chang | .............. | H01L 21/67775 |

FOREIGN PATENT DOCUMENTS

| | | |
|---|---|---|
| JP | 08-208005 | 8/1996 |
| JP | 2004-140011 | 5/2004 |
| KR | 10-2004-0051945 | 6/2004 |
| KR | 10-2009-0036367 | 4/2009 |
| KR | 10-2292126 | 8/2021 |
| KR | 10-2388037 | 4/2022 |

* cited by examiner

*Primary Examiner* — Kaitlin S Joerger

(57) ABSTRACT

A stocker system having an active shelf module capable of accommodating a plurality of carriers and a control method thereof are provided. The stocker system may include a stocker body having at least one accommodation space therein; an active shelf module installed on the stocker body and having at least a portion extended or retracted in a forward and reverse direction; and a controller configured to extend the active shelf module to receive a carrier from the outside of the stocker body and control the active shelf module to accommodate the carrier in the accommodation space inside the stocker body.

19 Claims, 14 Drawing Sheets

FIG. 13

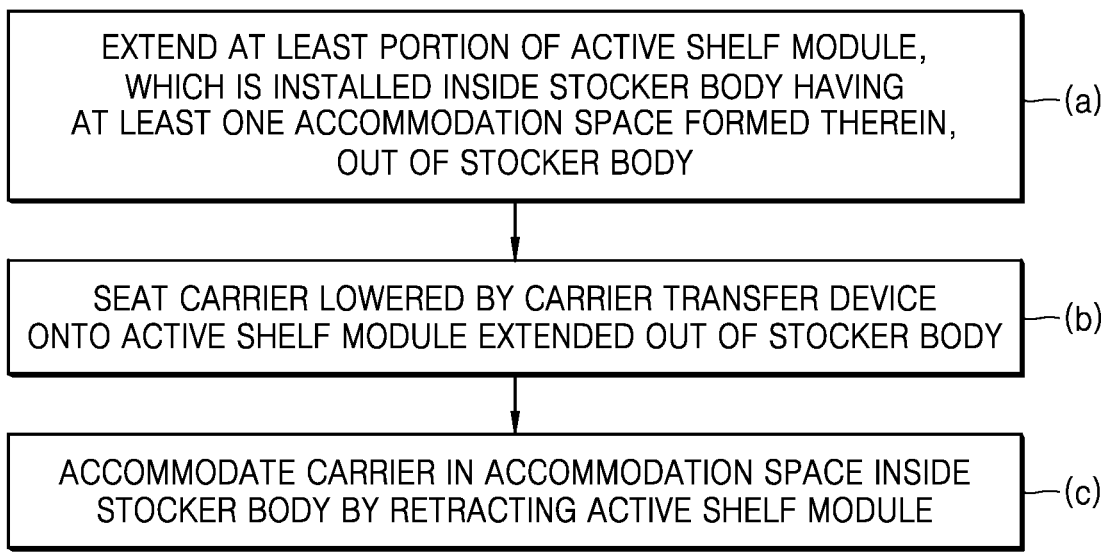

EXTEND AT LEAST PORTION OF ACTIVE SHELF MODULE, WHICH IS INSTALLED INSIDE STOCKER BODY HAVING AT LEAST ONE ACCOMMODATION SPACE FORMED THEREIN, OUT OF STOCKER BODY  —(a)

SEAT CARRIER LOWERED BY CARRIER TRANSFER DEVICE ONTO ACTIVE SHELF MODULE EXTENDED OUT OF STOCKER BODY  —(b)

ACCOMMODATE CARRIER IN ACCOMMODATION SPACE INSIDE STOCKER BODY BY RETRACTING ACTIVE SHELF MODULE  —(c)

STOCKER SYSTEM HAVING ACTIVE SHELF MODULE AND CONTROL METHOD THEREOF

CROSS-REFERENCE TO RELATED APPLICATION(S)

This application claims the benefit under 35 USC § 119(a) of Korean Patent Application No. 10-2022-0087456, filed on Jul. 15, 2022, in the Korean Intellectual Property Office, the entire disclosure of which is incorporated herein by reference for all purposes.

BACKGROUND

Field

The following description relates to a stocker system having an active shelf module and a control method thereof, and more particularly, to a stocker system having an active shelf module capable of accommodating a plurality of carriers and a control method thereof.

Description of Related Art

In a manufacturing process of a semiconductor device or a display device, an object to be processed, such as a wafer, a semiconductor substrate, a printed circuit board, or a reticle, may be stored in a stocker while being accommodated in a carrier.

The stocker may be provided with a plurality of shelves to accommodate carriers. The shelves may be arranged in horizontal and vertical directions. Various types of carriers, such as FOUP, FOSB, magazine, and reticle pod, may be used depending on the objects.

The stocker may be provided with a load port configured to load and unload the carriers and a transfer robot configured to transfer the carriers between the shelves.

The stocker includes the shelves, the load port, and the transfer robot, and thus requires ample space. Therefore, utilization of the space with the stocker may be reduced.

SUMMARY

The present invention is devised to solve various problems including the aforementioned problems. An object of the present invention is to provide a stocker system having an active shelf module and a control method thereof, which may allow installation of a shelf on a ceiling or a wall on which an active shelf module capable of receiving a carrier from the outside is installed, reduce footprint of a facility by increasing space utilization, increase carrier loading capacity due to a multi-level shelf structure with the active shelf module, and improve semiconductor productivity and process efficiency by adding a foldable movable frame that can be extended and retracted with respect to a fixed frame, thereby reducing transfer time. However, the object is merely illustrative, and the scope of the present invention is not limited thereto.

In one general aspect, a stocker system having an active shelf module may include: a stocker body having at least one accommodation space therein; an active shelf module installed on the stocker body and having at least a portion extended or retracted in a forward and reverse direction; and a controller configured to extend the active shelf module to receive a carrier from the outside of the stocker body and control the active shelf module to accommodate the carrier in the accommodation space inside the stocker body.

In addition, according to the present invention, the active shelf module may include: a seating plate formed in a shape corresponding to the carrier such that the carrier can be seated thereon; a base installed on the stocker body; and a driving device installed between the seating plate and the base and configured to raise the seating plate in an oblique direction or a vertical direction in the accommodation space and move the seating plate forward and backward out of the stocker body.

In addition, according to the present invention, the driving device may include: a cam member installed on one side or both sides of the base and having a cam groove portion extending from an upward path to a forward/backward path; a cam protrusion guided along the cam groove portion of the cam member; a moving carriage having the cam protrusion formed on one side thereof and configured to rise along the upward path along with the cam protrusion and move forward and backward along the forward/backward path; and an electric actuator configured to receive a control signal from the controller and raise and move the moving carriage forward and backward.

Also, according to the present invention, the electric actuator may have a link shaft installed at each of both ends to raise and move the moving carriage forward and backward with one electric actuator, have a piston extended and retracted by a motor, and be installed obliquely as a whole.

In addition, according to the present invention, the cam groove portion of the cam member may include a front cam groove portion and a rear cam groove portion, which are formed in parallel so as to be vertically spaced apart from each other so that the moving carriage can maintain a horizontal state, and the cam protrusion may include a front cam protrusion guided by the front cam groove portion and a rear cam protrusion guided by the rear cam groove portion.

In addition, according to the present invention, the moving carriage may include: a lifting platform configured to rise together with the cam protrusion in an oblique direction or a vertical direction along the upward path; and a first forward-backward moving platform configured to move forward and backward at a first stage in a horizontal direction along a first rail installed on the lifting platform.

Also, according to the present invention, the moving carriage may further include: a second forward-backward moving platform configured to move forward and backward at a second stage in the horizontal direction along a second rail installed on the first forward-backward moving platform when power is transmitted by a first power transmission device as the first forward-backward moving platform moves forward by means of the electric actuator; and a third forward-backward moving platform fixed to the seating plate and configured to move forward and backward at a third stage in the horizontal direction along a third rail installed on the second forward-backward moving platform when power is transmitted by a second power transmission device as the second forward-backward moving platform moves forward.

Moreover, according to the present invention, the first power transmission device may include: a (1-1)th pulley rotatably installed on the first forward-backward moving platform; a (1-2)th pulley spaced apart from the (1-1)th pulley in a forward or reverse direction and rotatably installed on the first forward-backward moving platform; and a (1-3)th belt which is wound around the (1-1)th pulley and the (1-2)th pulley and rotated and has one side fixed to the lifting platform and the other side fixed to the second forward-backward moving platform so that when the one side moves relatively forward, the other side moves relatively backward, or when the one side moves relatively backward, the other side moves relatively forward.

Also, according to the present invention, the second power transmission device may include: a (2-1)th pulley rotatably installed on the second forward-backward moving platform; a (2-2)th pulley spaced apart from the (2-1)th pulley in a forward or reverse direction and rotatably installed on the second forward-backward moving platform; and a (2-3)th belt which is wound around the (2-1)th pulley and the (2-2)th pulley and rotated and has one side fixed to the first forward-backward moving platform and the other side fixed to the third forward-backward moving platform so that when the one side moves relatively forward, the other side moves relatively backward, or when the one side moves relatively backward, the other side moves relatively forward.

In addition, according to the present invention, the seating plate may have at least one seating alignment pin formed on an upper surface thereof to correspond to an alignment groove of the carrier and at least one seating detection sensor installed to detect the seated carrier.

Moreover, according to the present invention, the active shelf module may further include a fixed plate installed on the stocker body and configured to support, along with the seating plate, the carrier accommodated in the accommodation space.

In addition, according to the present invention, the fixed plate may have a seating plate accommodating groove portion formed on an upper surface thereof to accommodate the seating plate; at least one auxiliary alignment pin formed to correspond to an alignment groove of the carrier and at least one storage detection sensor installed to detect the seated carrier.

In addition, according to the present invention, the fixed plate may have at least one purge port docked with a purge hole of the carrier on the upper surface to supply purge gas to the carrier and a discharge port configured to discharge the purge gas from the carrier.

In addition, according to the present invention, the stocker body may include a fixed frame fixed to a ceiling of a building or a part of a building and at least one movable frame having the active shelf module installed thereon and configured to extend from the fixed frame or retract toward the fixed frame such that the accommodation space is ensured when accommodating the carrier and a size of equipment is reduced as a whole by reducing the accommodation space when the carrier is not accommodated.

In addition, according to the present invention, the stocker body may further include a frame driving device installed on the fixed frame and extending or contracting the movable frame.

In addition, according to the present invention, the frame driving device may include: a left lifting actuator installed on a left side of the fixed frame to raise and lower the left side of the movable frame; and a right lifting actuator installed on a right side of the fixed frame to raise and lower the right side of the movable frame.

In another general aspect, a control method of a stocker system having an active shelf module may include: (a) extending at least a portion of an active shelf module, which is installed inside a stocker body having at least one accommodation space formed therein, out of the stocker body; (b) seating a carrier, which is lowered by a carrier transfer device, on the active shelf module extended out of the stocker body; and (c) accommodating the carrier in the accommodation space inside the stocker body by contracting the active shelf module.

In addition, according to the present invention, in operation (a), at least a portion of the active shelf module may be raised in an oblique direction or a vertical direction using one electric actuator installed obliquely as a whole and an extension control signal may be applied to the electric actuator to cause the portion of the active shelf module to move forward to the outside of the stocker body, and in operation (c), the portion of the active shelf module may be retracted into the stocker body by using the electric actuator and a retraction control signal may be applied to the electric actuator to cause the portion of the active shelf module to descend in an oblique direction or a vertical direction.

Further, according to the present invention, the control method may further include, after operation (c), (d) withdrawing the carrier out of the stocker body by extending at least a portion of the active shelf module; (e) raising and moving the withdrawn carrier to the carrier transfer device; (f) retracting at least a portion of the active shelf module which is empty into the stocker body; and (g) retracting a movable frame with respect to a fixed frame of the stocker body so as to reduce the empty accommodation space and allow space utilization.

In still another general aspect, a stocker system having an active shelf module may include: a stocker body having at least one accommodation space therein; an active shelf module installed on the stocker body and having at least a portion extended or retracted in a forward and reverse direction; and a controller configured to extend the active shelf module to receive a carrier from the outside of the stocker body and control the active shelf module to accommodate the carrier in the accommodation space inside the stocker body, wherein the active shelf module may include a seating plate formed in a shape corresponding to the carrier such that the carrier can be seated thereon; a base installed on the stocker body; and a driving device installed between the seating plate and the base and configured to raise the seating plate in an oblique direction or a vertical direction in the accommodation space and move the seating plate forward and backward out of the stocker body, the driving device may include a cam member installed on one side or both sides of the base and having a cam groove portion extending from an upward path to a forward/backward path; a cam protrusion guided along the cam groove portion of the cam member; a moving carriage having the cam protrusion formed on one side thereof and configured to rise along the upward path along with the cam protrusion and move forward and backward along the forward/backward path; and an electric actuator configured to receive a control signal from the controller and raise and move the moving carriage forward and backward, the moving carriage may include: a lifting platform configured to rise together with the cam protrusion in an oblique direction or a vertical direction along the upward path; a first forward-backward moving platform configured to move forward and backward at a first stage in a horizontal direction along a first rail installed on the lifting platform; a second forward-backward moving platform configured to move forward and backward at a second stage in the horizontal direction along a second rail installed on the first forward-backward moving platform when power is transmitted by a first power transmission device as the first forward-backward moving platform moves forward by means of the electric actuator; and a third forward-backward moving platform fixed to the seating plate and configured to move forward and backward at a third stage in the horizontal direction along a third rail installed on the second forward-backward moving platform when power is transmitted by a second power transmission device as the second forward-backward moving platform moves forward, the first power transmission device may include a (1-1)th pulley rotatably installed on the first forward-backward moving platform; a (1-2)th pulley spaced apart from the (1-1)th pulley in a forward or reverse direction and rotatably installed on the first forward-backward moving platform; and a (1-3)th belt which is wound around the (1-1)th pulley and the (1-2)th pulley and rotated and has one side fixed to the lifting platform and the other side fixed to the second forward-backward moving platform so that when the one side moves relatively forward, the other side moves relatively backward, or when the one side moves relatively backward, the other side moves relatively forward, and the second power transmission device may include a (2-1)th pulley rotatably installed on the second forward-backward moving platform; a (2-2)th pulley spaced apart from the (2-1)th pulley in a forward or reverse direction and rotatably installed on the second forward-backward moving platform; and a (2-3)th belt which is wound around the (2-1)th pulley and the (2-2)th pulley and rotated and has one side fixed to the first forward-backward moving platform and the other side fixed to the third forward-backward moving platform so that when the one side moves relatively forward, the other side moves relatively backward, or when the one side moves relatively backward, the other side moves relatively forward.

Other features and aspects will be apparent from the following detailed description, the drawings, and the claims.

BRIEF DESCRIPTION OF THE DRAWINGS

FIG. 13 is a flowchart illustrating a control method of a stocker system having an active shelf module according to some embodiments of the present invention.

Figure 1:
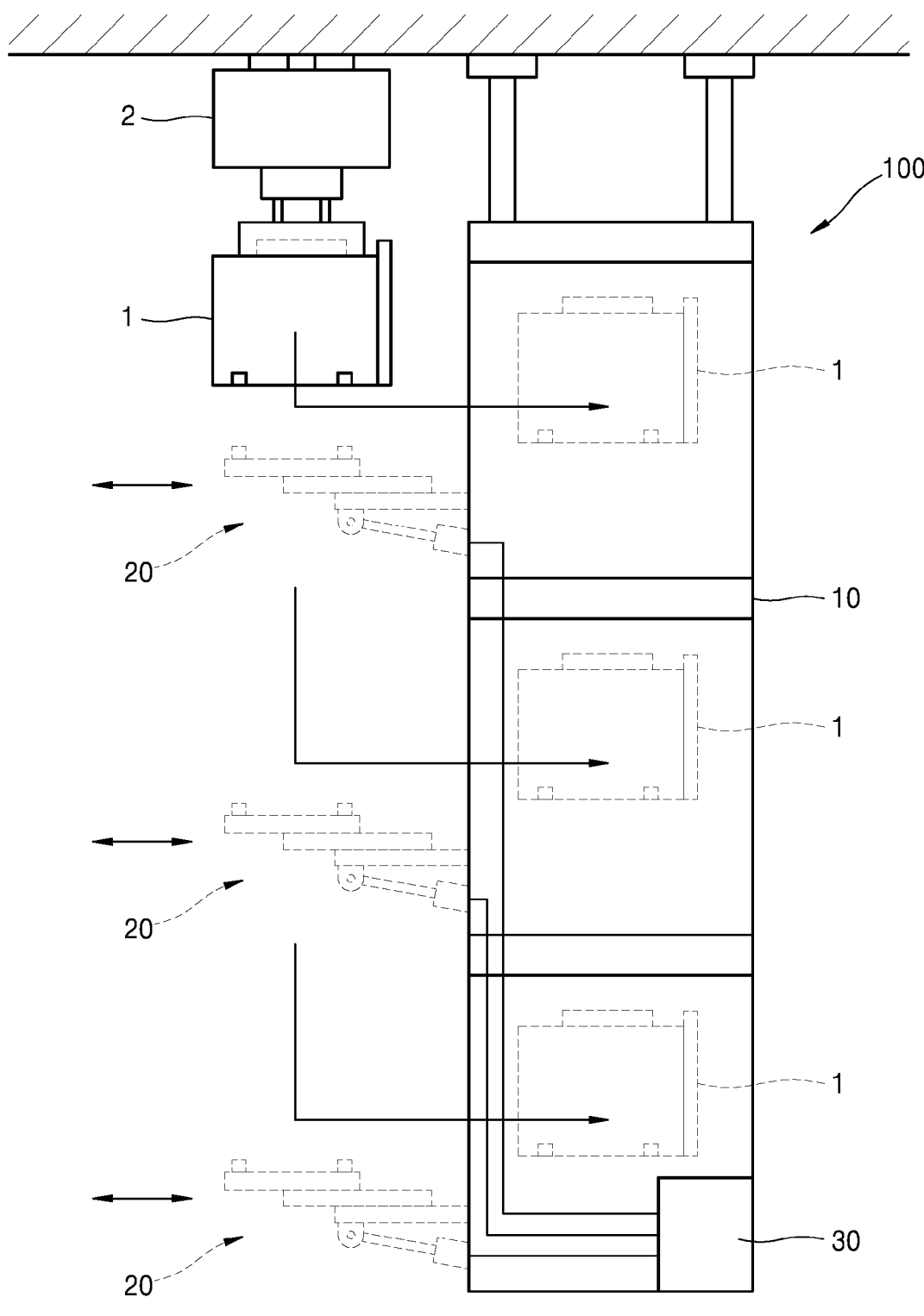
FIG. 1 is a side view illustrating a stocker system having an active shelf module according to some embodiments of the present invention.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

Hereinafter, various embodiments of the present invention will be described in detail with reference to the accompanying drawings.

The embodiments of the present invention are provided for more fully describing the present invention to those skilled in the art, and the embodiments below may be modified in various forms, and the scope of the present invention is not limited to the embodiments below. Rather, these embodiments are provided such that this disclosure will be thorough and complete and will fully convey the spirit of the present invention to those skilled in the art. Also, thickness or sizes of layers in the drawings are exaggerated for convenience of explanation and clarity.

The terminology used herein is for the purpose of describing particular embodiments only and is not intended to be limiting of exemplary embodiments. As used herein, the singular forms "a", "an" and "the" are intended to include the plural forms as well, unless the context clearly indicates otherwise. It will be further understood that the terms "comprises" and/or "comprising" used herein specify the presence of stated features, integers, steps, operations, members, components, and/or groups thereof, but do not preclude the presence or addition of one or more other features, integers, steps, operations, members, components, and/or groups thereof.

Hereinafter, the embodiments of the present invention are described in detail with reference to the accompanying drawings. In the drawings, the illustrated shapes may be modified according to, for example, manufacturing technology and/or tolerance. Thus, the embodiment of the present invention may not be construed to be limited to a particular shape of a part described in the present specification and may include a change in the shape generated during manufacturing, for example.

Figure 2:
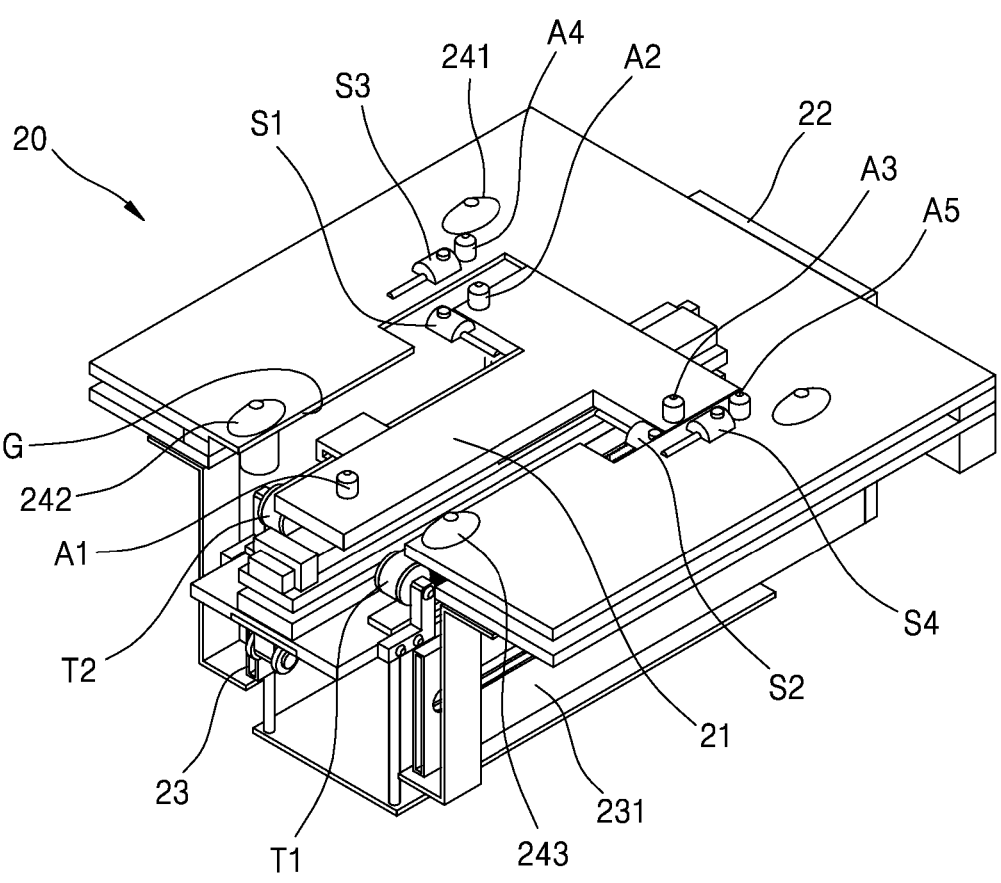
FIG. 2 is a perspective view illustrating an active shelf module of the stocker system of FIG. 1.
Figure 3:
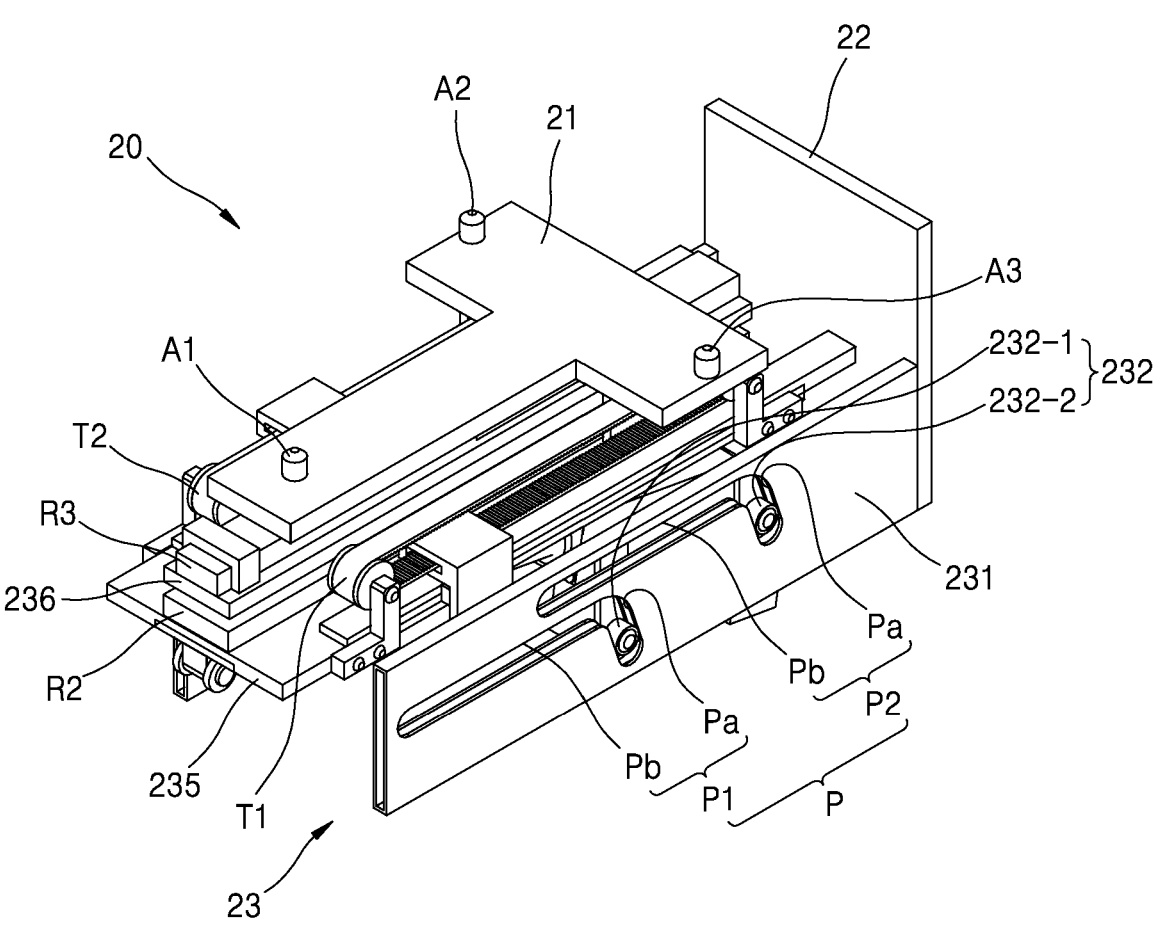
FIG. 3 is a perspective view illustrating a reverse movement state of a driving device of the active shelf module of the stocker system of FIG. 2.
Figure 4:
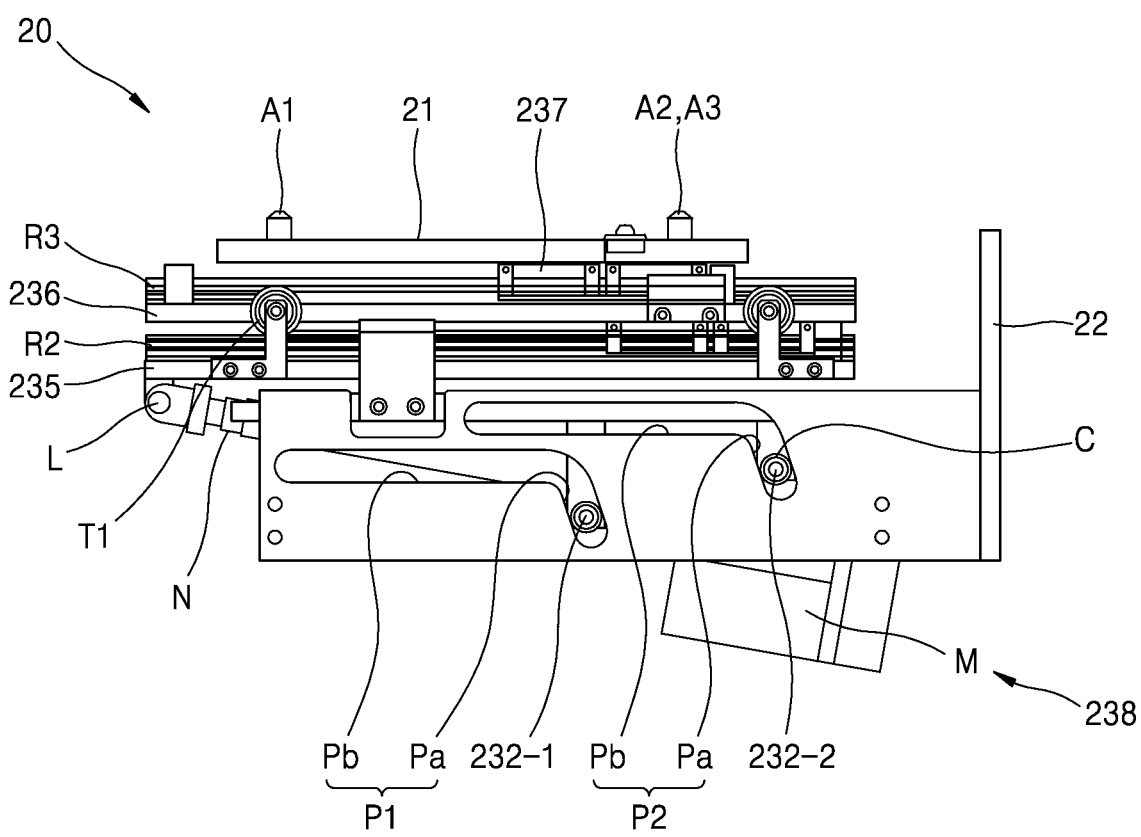
FIG. 4 is a side view illustrating the reverse movement state of the driving device of the active shelf module of the stocker system of FIG. 3.
Figure 5:
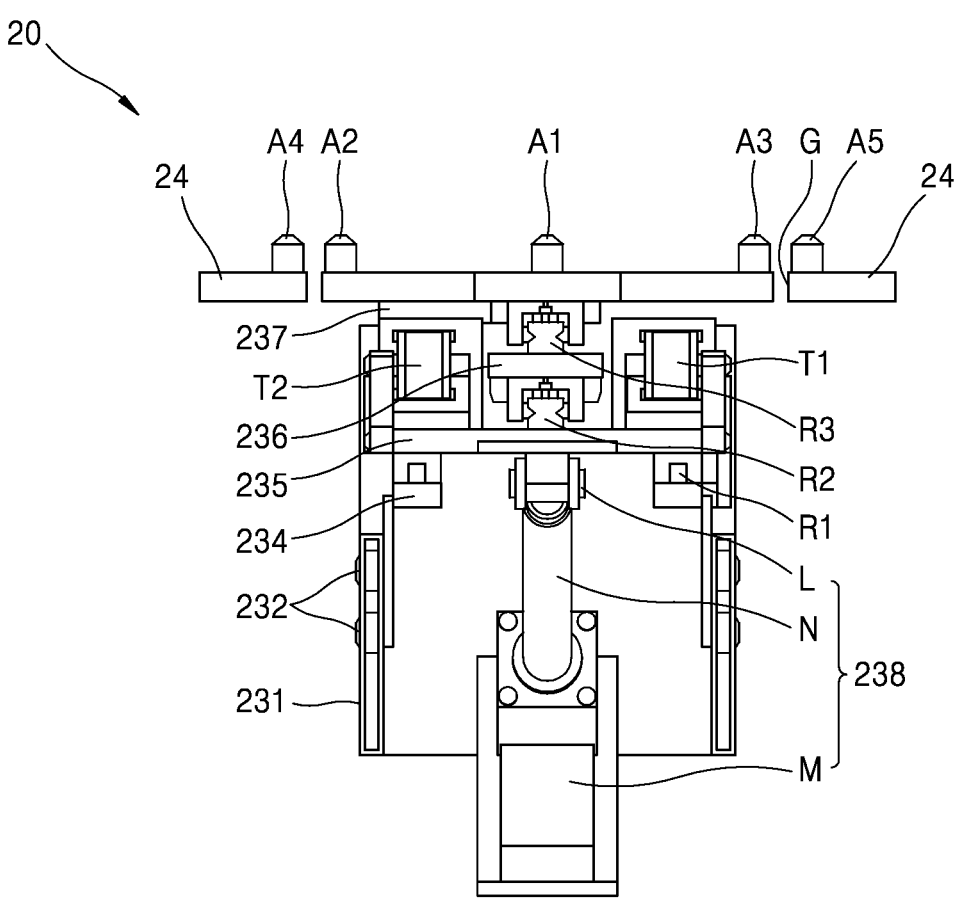
FIG. 5 is a front view illustrating the reverse movement state of the driving device of the active shelf module of the stocker system of FIG. 3.
Figure 6:
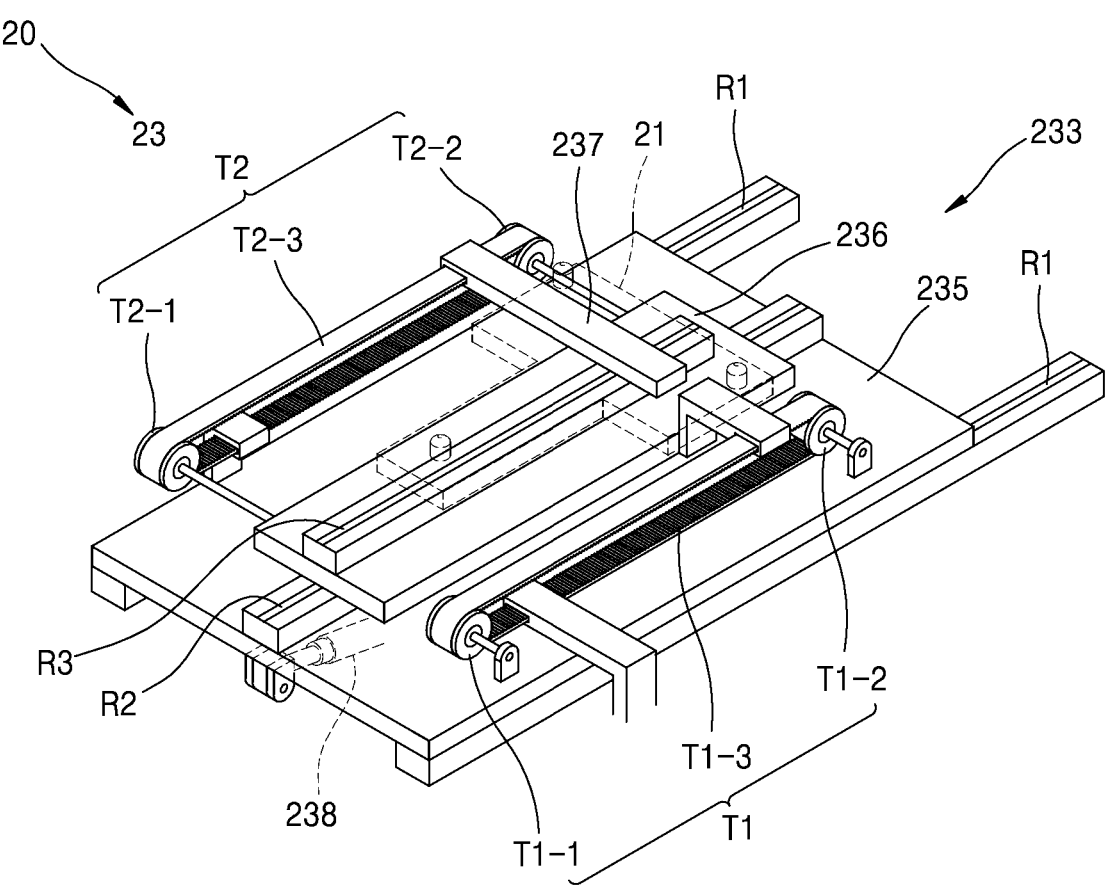
FIG. 6 is a perspective view illustrating an operation in the reverse movement state of the driving device of the active shelf module of the stocker system of FIG. 3.

FIG. 1 is a side view illustrating a stocker system 100 having an active shelf module according to some embodiments of the present invention, FIG. 2 is a perspective view illustrating an active shelf module 20 of the stocker system 100 of FIG. 1, FIG. 3 is a perspective view illustrating a reverse movement state of a driving device 23 of the active shelf module 20 of the stocker system 100 of FIG. 2, FIG. 4 is a side view illustrating the reverse movement state of the driving device 23 of the active shelf module 20 of the stocker system 100 of FIG. 3, FIG. 5 is a front view illustrating the reverse movement state of the driving device 23 of the active shelf module 20 of the stocker system 100 of FIG. 3, and FIG. 6 is a perspective view illustrating an operation in the reverse movement state of the driving device 23 of the active shelf module 20 of the stocker system 100 of FIG. 3.

First, as shown in FIGS. 1 to 6, the stocker system 100 having an active shelf module according to some embodiments of the present invention may include a stocker body 10 having at least one accommodation space therein, the active shelf module 20 installed on the stocker body 10 and having at least a portion extended or retracted in a forward and reverse direction, and a controller 30 configured to extend the active shelf module 20 to receive a carrier 1 from the outside of the stocker body 10 and control the active shelf module 20 to accommodate the carrier 1 in the accommodation space inside the stocker body 10.

Here, a wide variety of carriers, such as FOUPs, FOSBs, magazines, reticle pods, etc., which can accommodate objects to be processed, such as wafers of various types or shapes, semiconductor substrates, printed circuit boards, and reticles and store or transfer the accommodated objects while isolating them from the outside, may all be applied as the carrier 1.

For example, the stocker body 10 is a type of fixed frame that can be installed on a ceiling or wall, and may be a shelf structure that is formed to have at least one accommodation space therein by welding, assembling, or connecting various types of vertical members, horizontal members, and panel members to have sufficient strength and durability to support the above-described active shelf module 20, the controller 30, and other purge gas supply pipes as well as the carrier 1.

However, the stocker body 10 is not necessarily limited to the drawings, and, for example, shelf structures of various shapes and types that are installed in multiple floors on the floor of a building or formed in a three-dimensional structure along the wall of a building may all be applied.

In addition, for example, the active shelf module 20 may include a seating plate 21 formed in a shape corresponding to the carrier 1 such that the carrier 1 can be seated thereon; a fixed plate 24 installed on the stocker body 10 and configured to support, along with the seating plate 21, the carrier 1 accommodated in the accommodation space; a base 22 installed on the stocker body; and a driving device 23 installed between the seating plate 21 and the base 22 and configured to raise the seating plate 21 in an oblique direction or a vertical direction in the accommodation space, and may move the seating plate 21 forward and backward out of the stocker body 10.

More specifically, for example, as shown in FIG. 2, the seating plate 21 may have at least one seating alignment pins A1, A2, and A3 formed on the upper surface thereof to correspond to alignment grooves of the carrier 1, and at least one seating detection sensors S1 and S2 installed to detect the seated carrier 1.

The seating plate 21 may include a total of three seating alignment pins A1, A2, and A3, one front seating alignment pin and two rear seating alignment pins, corresponding to three alignment grooves formed on the lower surface of the carrier 1. Thus, the seating plate 21 may be a T-shaped panel as a whole to efficiently support the three seating alignment pins A1, A2, and A3.

Therefore, the carrier 1 may be aligned and supported on the seating plate 21 using the seating alignment pins A1, A2, and A3, and the seated state of the carrier 1 may be detected using the seating detection sensors S1 and S2.

In addition, for example, the fixed plate 24 may have a seating plate accommodating groove portion G formed on the upper surface thereof to accommodate the seating plate 21; at least one auxiliary alignment pins A4 and A5 formed to correspond to the alignment grooves of the carrier 1; and at least one storage detection sensors S3 and S4 installed to detect the seated carrier 1.

Here, the fixed plate 24 may have at least one purge ports 241, 242, and 243 docked with purge holes of the carrier 1 on the upper surface to supply purge gas to the carrier 1 and a discharge port 244 configured to discharge the purge gas from the carrier 1.

Therefore, the seating plate 21 may wait in the accommodating groove portion G of the fixed plate 24, may be raised first by the driving device 23, and then move forward and extend in three stages.

More specifically, for example, the driving device 23 may include a cam member 231 installed on one side or both sides of the base 22 and having a cam groove portion P extending from an upward path Pa to a forward/backward path Pb, a cam protrusion 232 guided along the cam groove portion P of the cam member 231; a moving carriage 233 having the cam protrusion 232 formed on one side thereof and configured to rise along the upward path Pa along with the cam protrusion 232 and move forward and backward along the forward/backward path Pb, and an electric actuator 238 configured to receive a control signal from the controller 30 and raise and move the moving carriage 233 forward and backward.

Here, the electric actuator 238, which is a type of actuator capable of rotating a screw rod by using the rotational force of a motor and extending and retracting a piston in the form of a telescopic antenna, may have a link shaft L installed at each of both ends to raise and move the moving carriage 233 forward and backward with one electric actuator, have a piston N extended and retracted by a motor M, and be installed obliquely as a whole so that the overall inclination angle may be changed during extension and retraction.

However, the electric actuator 238 is not limited only to the drawings, and in addition, various types of actuators, such as pneumatic cylinders, hydraulic cylinders, and the like, may all be applied.

In addition, for example, the cam groove portion P of the cam member 231 may include a front cam groove portion P1 and a rear cam groove portion P2, which are formed in parallel so as to be vertically spaced apart from each other so that the moving carriage 233 can maintain a horizontal state. The cam protrusion 232 may include a front cam protrusion 232-1 guided by the front cam groove portion P1 and a rear cam protrusion 232-2 guided by the rear cam groove portion P2.

A cam follower C capable of free rotation in the form of a bearing may be formed on each of the front cam protrusion 232-1 and the rear cam protrusion 232-2 so that the friction between the cam protrusion 232 and the cam groove portion P can be minimized.

More specifically, for example, the moving carriage 233 has a structure that can be extended and retracted in three stages while ascending and descending as a whole, and may include a lifting platform 234 configured to rise together with the cam protrusion 232 in an oblique direction or a vertical direction along the upward path Pa; a first forward-backward moving platform 235 configured to move forward and backward at a first stage in a horizontal direction along a first rail R1 installed on the lifting platform 234; a second forward-backward moving platform 236 configured to move forward and backward at a second stage in the horizontal direction along a second rail R2 installed on the first forward-backward moving platform 235 when power is transmitted by a first power transmission device T1 as the first forward-backward moving platform 235 moves forward by means of the electric actuator 238; and a third forward-backward moving platform 237 fixed to the seating plate 21 and configured to move forward and backward at a third stage in the horizontal direction along a third rail R3 installed on the second forward-backward moving platform 236 when power is transmitted by a second power transmission device T2 as the second forward-backward moving platform 236 moves forward.

Here, the first power transmission device T1 and the second power transmission device T2 may be two pairs of a combination of a belt and pulleys, which are respectively installed on the left and right sides below the seating plate 21, so that the moving carriage 233 can be extended and retracted to the desired length by transmitting forward/backward moving power to the first forward-backward moving platform 235, the second forward-backward moving platform 236, and the third forward-backward moving platform 237 with only one electric actuator 238.

More specifically, for example, the first power transmission device T1 may include a (1-1)th pulley T1-1 rotatably installed on the first forward-backward moving platform 235, a (1-2)th pulley T1-2 spaced apart from the (1-1)th pulley T1-1 in a forward or reverse direction and rotatably installed on the first forward-backward moving platform 235, and a (1-3)th belt T1-3 which is wound around the (1-1)th pulley T1-1 and the (1-2)th pulley T1-2 and rotated and has one side fixed to the lifting platform 234 and the other side fixed to the second forward-backward moving platform 236 so that when the one side moves relatively forward, the other side moves relatively backward, or when the one side moves relatively backward, the other side moves relatively forward.

In addition, for example, the second power transmission device T2 may include a (2-1)th pulley T2-1 rotatably installed on the second forward-backward moving platform 236, a (2-2)th pulley T2-2 spaced apart from the (2-1)th pulley T2-1 in a forward or reverse direction and rotatably installed on the second forward-backward moving platform 236, and a (2-3)th belt T2-3 which is wound around the (2-1)th pulley T2-1 and the (2-2)th pulley T2-2 and rotated and has one side fixed to the first forward-backward moving platform 235 and the other side fixed to the third forward-backward moving platform 237 so that when the one side moves relatively forward, the other side moves relatively backward, or when the one side moves relatively backward, the other side moves relatively forward.

However, the power transmission device is not necessarily limited to a combination of belt and pulleys, and various shapes and types of power transmission devices capable of transmitting forward and backward power in multiple stages may all be applied.

Figure 7:
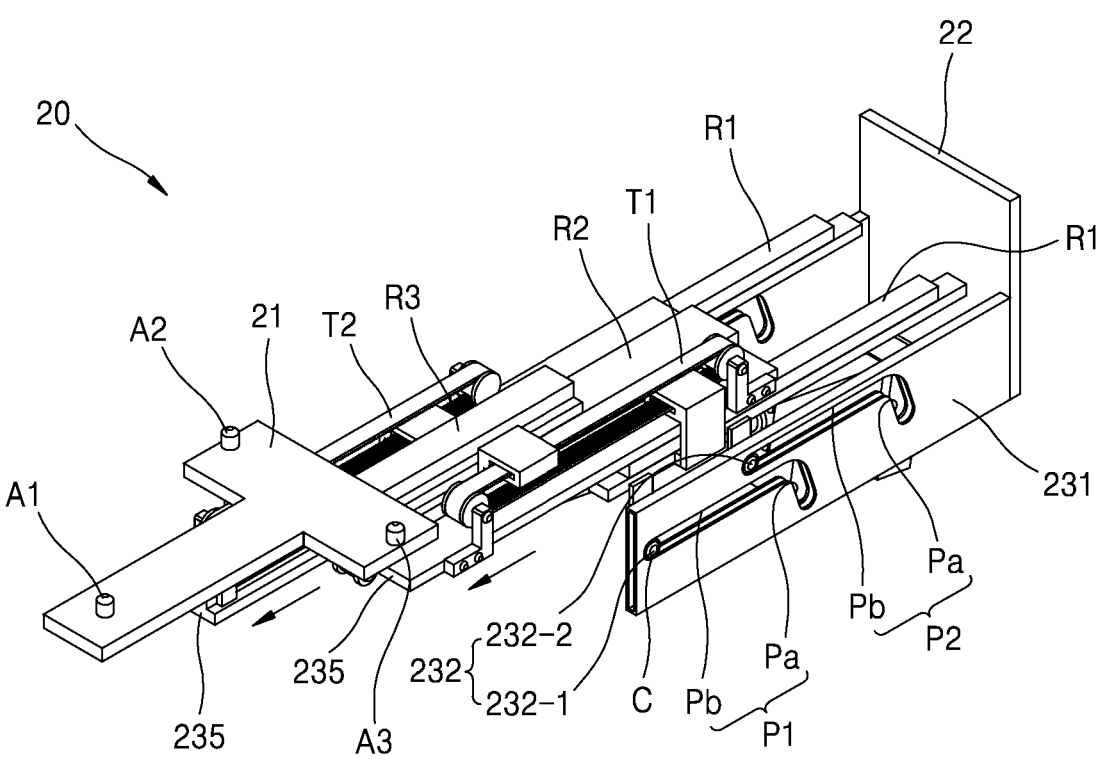
FIG. 7 is a perspective view illustrating a forward movement state of the driving device of the active shelf module of the stocker system of FIG. 3.
Figure 8:
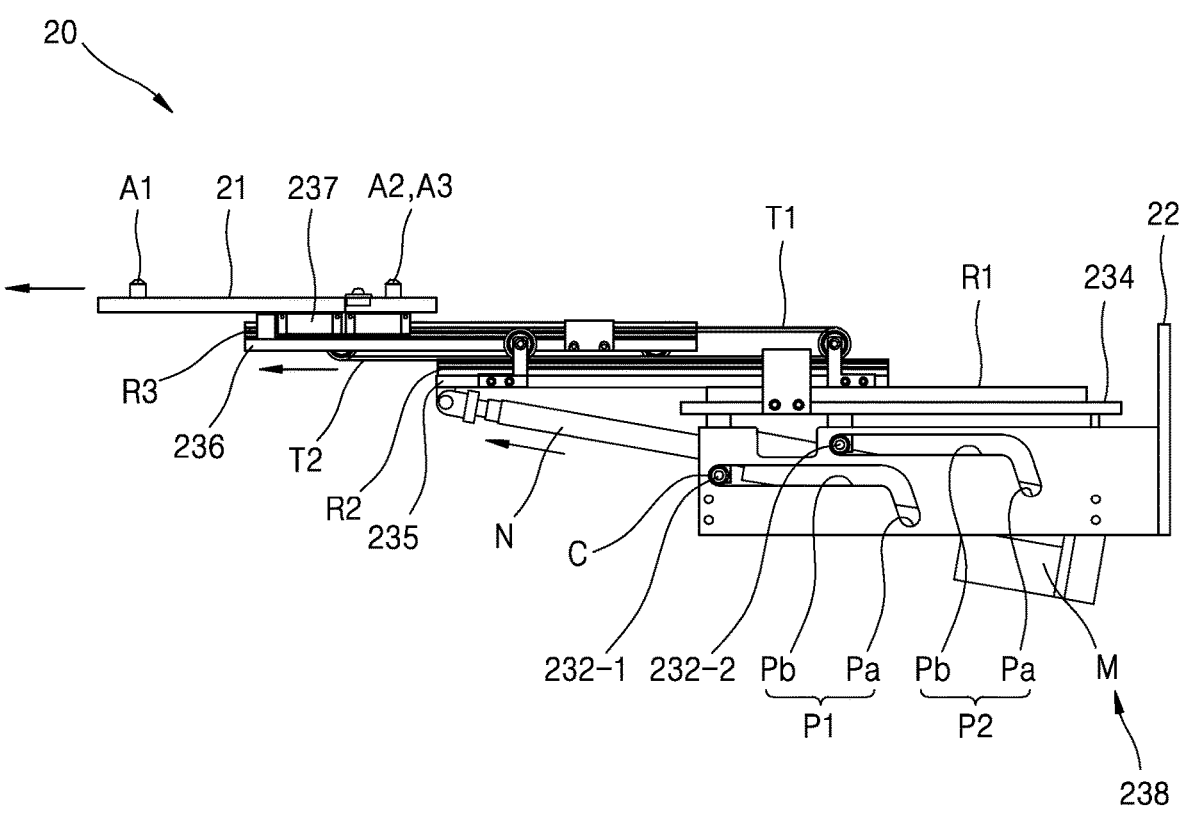
FIG. 8 is a side view illustrating the forward movement state of the driving device of the active shelf module of the stocker system of FIG. 3.
Figure 9:
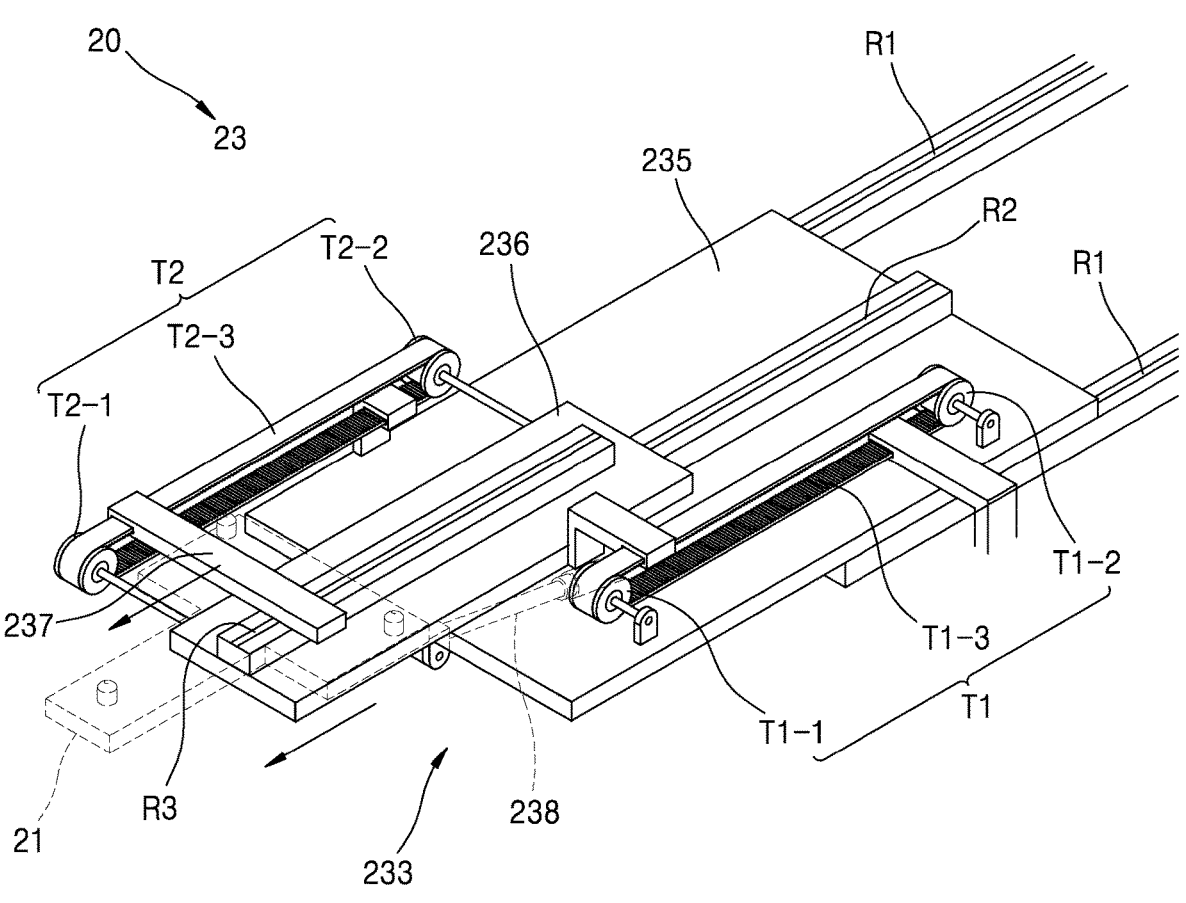
FIG. 9 is a perspective view illustrating an operation in the forward movement state of the driving device of the active shelf module of the stocker system of FIG. 3.

FIG. 7 is a perspective view illustrating a forward movement state of the driving device 23 of the active shelf module 20 of the stocker system 100 of FIG. 3, FIG. 8 is a side view illustrating the forward movement state of the driving device 23 of the active shelf module 20 of the stocker system 100 of FIG. 3, and FIG. 9 is a perspective view illustrating an operation in the forward movement state of the driving device 23 of the active shelf module 20 of the stocker system 100 of FIG. 3.

The operation process of the stocker system 100 having an active shelf module according to some embodiments of the present invention will be described with reference to FIGS. 2 to 9. First, as shown in FIGS. 2 to 6, when the electric actuator 238 of the driving device 23 is retracted, the seating plate 21 may move backward and wait in the accommodating groove portion G of the fixed plate 24.

Subsequently, as shown in FIGS. 7 to 9, when the electric actuator 238 of the driving device 23 is extended, the seating plate 21 may be first raised, and then deviated from the accommodating groove portion G of the fixed plate 24.

At this time, when the electric actuator 238 is extended, the lifting platform 234 of the moving carriage 233 engaged with the cam protrusion 232 may rise along the upward path Pa of the cam groove portion P together with the cam protrusion 232.

Then, when the cam protrusion 232 moves forward or backward along the forward/backward path Pb of the cam groove portion P, the first forward-backward moving platform 235 may be primarily moved forward by the electric actuator 238. When the first forward-backward moving platform 235 moves forward, the second forward-backward moving platform 236 may be secondarily moved farther than the first forward-backward moving platform 235 by the first power transmission device T1. And, when the second forward-backward moving platform 236 moves forward, the third forward-backward moving platform 237 may be tertiarily moved farther than the second forward-backward moving platform 236 by the second power transmission device T2, and ultimately the seating plate 21 may be moved forward in three steps together with the third forward-backward moving platform 236.

Therefore, it is possible to greatly reduce the manufacturing cost of a facility by enabling all the upward and downward movement and the forward and backward movement with only one electric actuator 238. Also, the power transmission devices T1 and T2 using two pairs of the combination of a belt and pulleys, and the three-stage forward-backward moving platforms 235, 236, and 237 are applied to maximize a stroke distance, thereby allowing the carrier 1 of various sizes to be safely accommodated.

Figure 10:
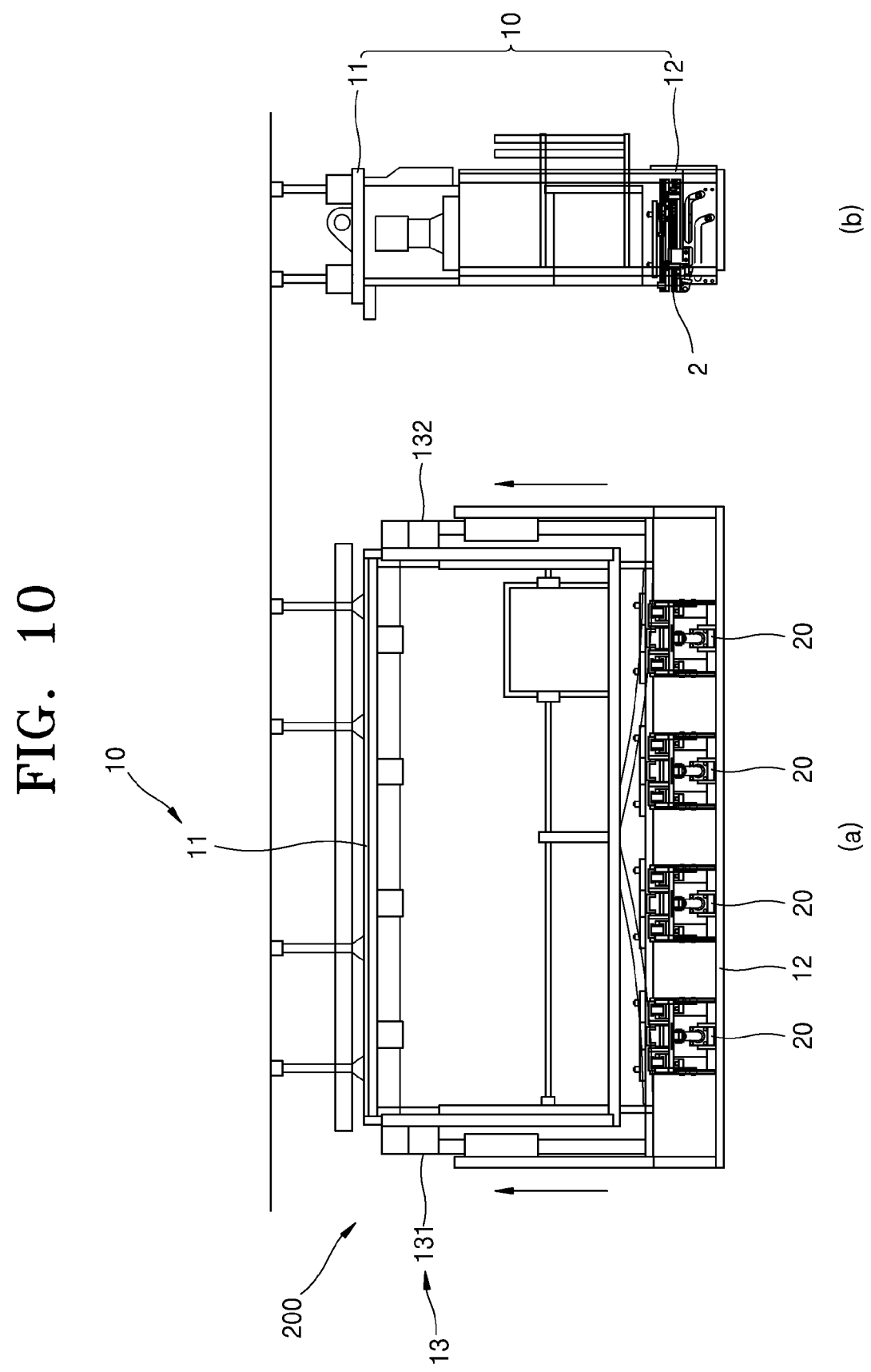
FIG. 10 shows views illustrating a movable frame which is retracted with respect to a fixed frame of a stocker system having an active shelf module according to some other embodiments of the present invention.
Figure 11:
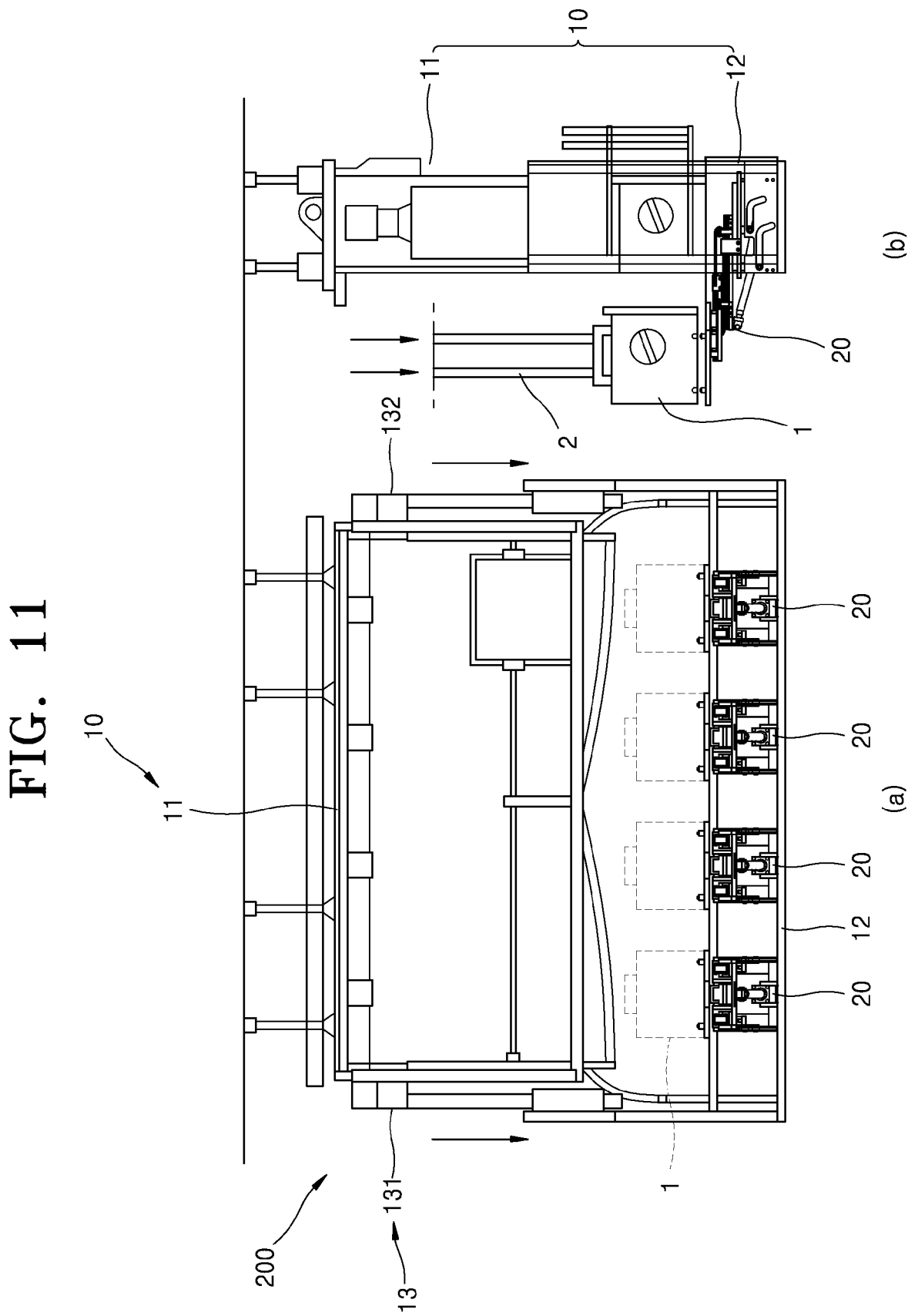
FIG. 11 shows views illustrating the movable frame which is extended with respect to the fixed frame of the stocker system of FIG. 10.

FIG. 10 shows views illustrating a movable frame 12 which is retracted with respect to a fixed frame 11 of a stocker system 200 having an active shelf module according to some other embodiments of the present invention, and FIG. 11 shows views illustrating the movable frame 12 which is extended with respect to the fixed frame 11 of the stocker system 200 of FIG. 10.

As shown in FIGS. 10 and 11, a stocker body 10 of the stocker system 200 having an active shelf module according to some other embodiments of the present invention may include a fixed frame 11 fixed to a ceiling of a building or a part of a building, at least one movable frame 12 having the active shelf module 20 installed thereon and configured to extend from the fixed frame 11 or retract toward the fixed frame 11 such that the accommodation space is ensured when accommodating the carrier and a size of equipment is reduced as a whole by reducing the accommodation space when the carrier is not accommodated, and a frame driving device 13 installed on the fixed frame 11 and configured to extend or retract the movable frame 12.

Here, the frame driving device 13 may include a left lifting actuator 131 installed on the left side of the fixed frame to raise and lower the left side of the movable frame 12 and a right lifting actuator 132 installed on the right side of the fixed frame 11 to raise and lower the right side of the movable frame 12.

In this case, in conjunction with such a retractable frame, various pipes and wires of the facility may also be formed with a margin, or formed to be retractable.

Not only the electric actuator described above, but also a wide variety of driving devices, such as various pneumatic cylinders, hydraulic cylinders, and linear motors, may be applied to the frame driving device 13.

11

Figure 12:
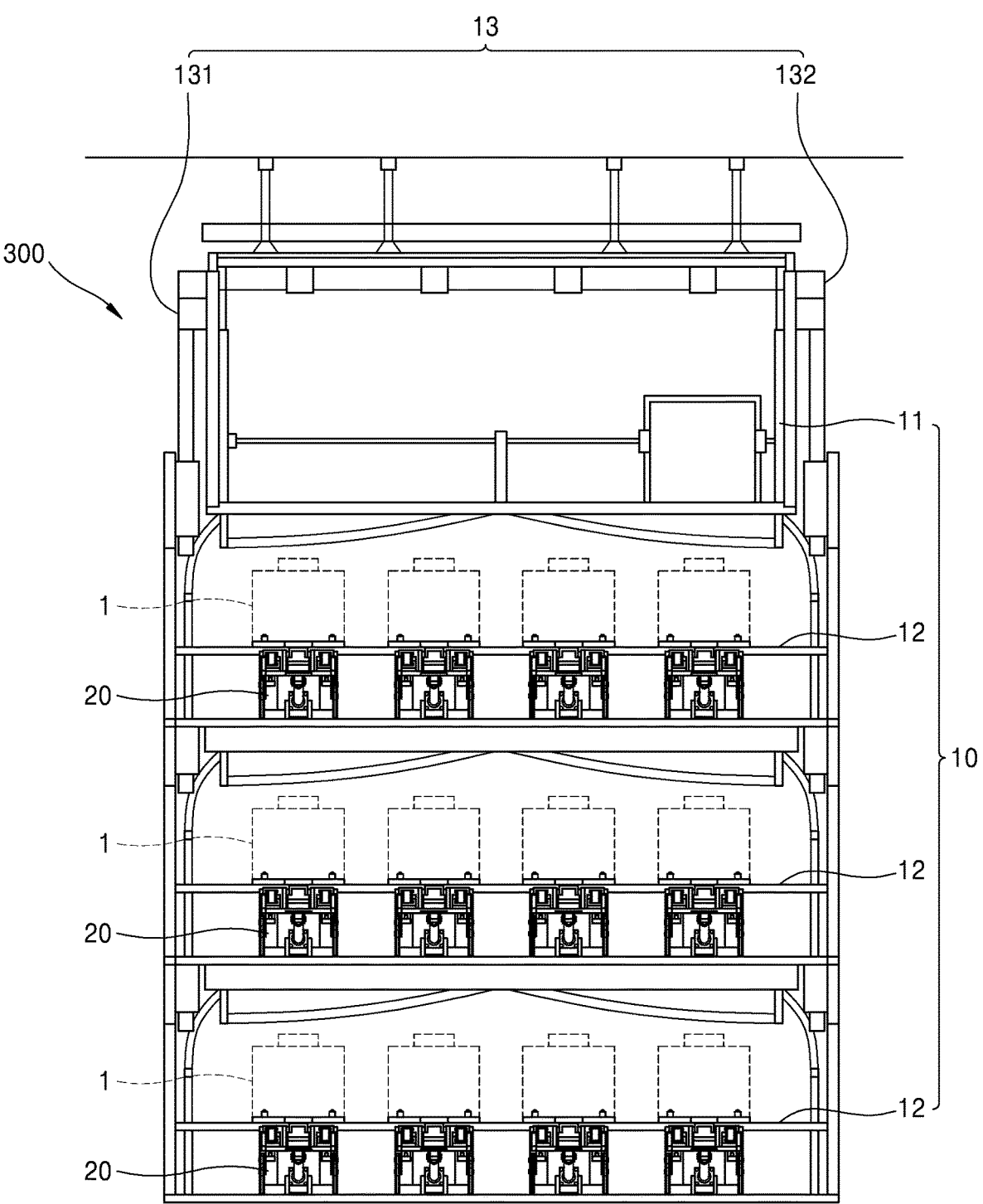
FIG. 12 is a front view illustrating a movable frame which is extended with respect to a fixed frame of a stocker system having an active shelf module according to some other embodiments of the present invention.

FIG. 12 is a front view illustrating a movable frame 12 which is extended with respect to a fixed frame 11 of a stocker system 300 having an active shelf module according to some other embodiments of the present invention.

As shown in FIG. 12, the stocker system 300 having an active shelf module according to some other embodiments of the present invention may include the movable frame 12 in the form of a multiple-stage movable frame to accommodate a large amount of carriers 1, and may retract the movable frame 12, which is empty as the carriers 1 are not accommodated, in the direction of the fixed frame 11 to maximize space utilization of equipment.

The number of installed stages of the movable frame 12 is not necessarily limited only to the drawings, and the movable frame 12 with various number of stages may be installed.

In this case, in conjunction with such a retractable frame, various pipes and wires of the facility may also be formed with a margin, or formed to be retractable.

FIG. 13 is a flowchart illustrating a control method of a stocker system having an active shelf module according to some embodiments of the present invention.

As shown in FIG. 13, a control method of a stocker system having an active shelf module according to some embodiments of the present invention may include: (a) extending at least a portion of an active shelf module 20, which is installed inside a stocker body 10 having at least one accommodation space formed therein, out of the stocker body 10; (b) seating a carrier 1, lowered by a carrier transfer device 2, on the active shelf module 20 extended out of the stocker body 10; and (c) accommodating the carrier 1 in the accommodation space inside the stocker body 10 by retracting the active shelf module 20.

Here, in operation (a), at least a portion of the active shelf module 20 may be raised in an oblique direction or a vertical direction using one electric actuator 238 installed obliquely as a whole, an extension control signal may be applied to the electric actuator 238 to cause the portion of the active shelf module 20 to move forward to the outside of the stocker body 10, and in operation (c), the portion of the active shelf module 20 may be retracted into the stocker body by using the electric actuator 238, and a retraction control signal may be applied to the electric actuator 238 to cause the portion of the active shelf module 20 to descend in an oblique direction or a vertical direction.

Therefore, according to the present invention, a series of processes of extending at least a portion of the active shelf module 20 out of the stocker body 10, seating the carrier 1 on the active shelf module 20 extended out of the stocker body 10, and receiving the carrier 1 in the accommodation space inside the stocker body 10 by retracting the active shelf module 20 may be performed.

Figure 14:
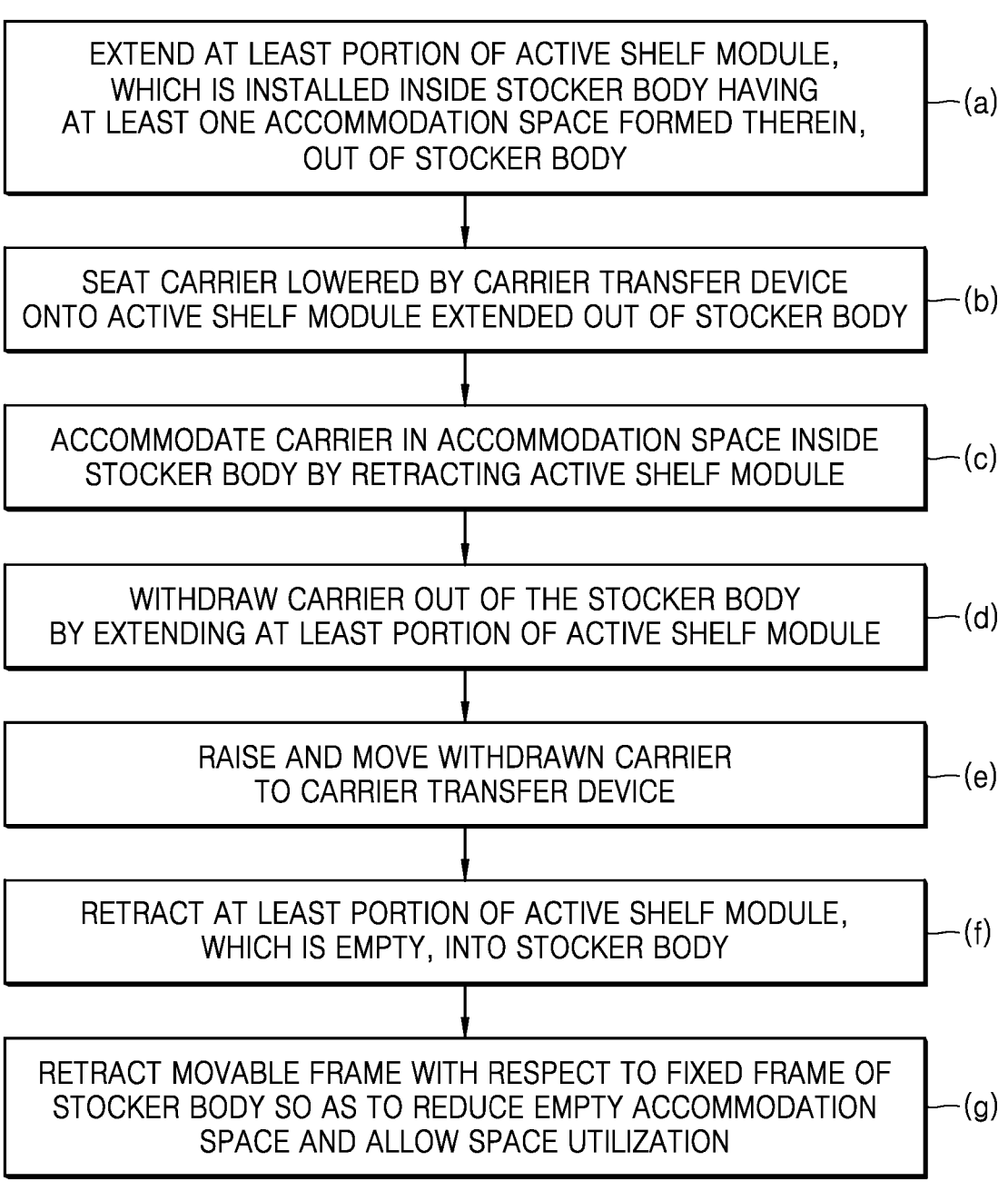
FIG. 14 is a flowchart illustrating a control method of a stocker system having an active shelf module according to some other embodiments of the present invention.

FIG. 14 is a flowchart illustrating a control method of a stocker system having an active shelf module according to some other embodiments of the present invention.

As shown in FIG. 14, a control method of a stocker system having an active shelf module according to some other embodiments of the present invention may include: (a) extending at least a portion of an active shelf module 20, which is installed inside a stocker body 10 having at least one accommodation space formed therein, out of the stocker body 10; (b) seating a carrier 1, lowered by a carrier transfer device 2, on the active shelf module 20 extended out of the stocker body 10; (c) accommodating the carrier 1 in the accommodation space inside the stocker body 10 by retracting the active shelf module 20; (d) withdrawing the carrier 1 out of the stocker body 10 by extending at least a portion of the active shelf module 20; (e) raising and moving the withdrawn carrier 1 to the carrier transfer device 2; (f) retracting at least a portion of the active shelf module 20 which is empty into the stocker body 10; and (g) retracting a movable frame 12 with respect to a fixed frame 11 of the stocker body 10 so as to reduce the empty accommodation space and allow space utilization.

Therefore, shelves on which the active shelf module capable of receiving a carrier from the outside is installed may be installed on a ceiling or walls, and footprint of a facility may be reduced by increasing space utilization, and a multi-level shelf structure is feasible with the active shelf module, and thus carrier loading capacity can be increased. Also, the addition of facility by adding a foldable movable frame that can be extended and retracted with respect to a fixed frame may greatly improve semiconductor productivity and process efficiency, thereby reducing transfer time, up and down movement and forward and backward movement are all enabled by only one electric actuator, which allows a great reduction of manufacturing costs, and carriers of various sizes may be safely accommodated by maximizing the forward and backward stroke distance by applying three-stage forward-backward moving platforms using two pairs of a combination of a belt and pulleys.

According to various embodiments of the present invention described above, shelves on which the active shelf module capable of receiving a carrier from the outside is installed may be installed on a ceiling or walls, and footprint of a facility may be reduced by increasing space utilization, and a multi-level shelf structure is feasible with the active shelf module, and thus carrier loading capacity can be increased. Also, the addition of facility by adding a foldable movable frame that can be extended and retracted with respect to a fixed frame may greatly improve semiconductor productivity and process efficiency, thereby reducing transfer time, up and down movement and forward and backward movement are all enabled by only one electric actuator, which allows a great reduction of manufacturing costs, and carriers of various sizes may be safely accommodated by maximizing the forward and backward stroke distance by applying three-stage forward-backward moving platforms using two pairs of a combination of a belt and pulleys. However, the scope of the present invention is not limited by the above effects.

While the present invention has been particularly shown and described with reference to embodiments thereof, it will be understood by those of ordinary skill in the art that various changes in form and details may be made therein without departing from the spirit and scope of the present invention as defined by the following claims.

REFERENCE NUMERALS

1: CARRIER
2: CARRIER TRANSFER DEVICE
10: STOCKER BODY
11: FIXED FRAME
12: MOVABLE FRAME
13: FRAME DRIVING DEVICE
131: LEFT LIFTING ACTUATOR
132: RIGHT LIFTING ACTUATOR
20: ACTIVE SHELF MODULE
21: SEATING PLATE
A1, A2, A3: SEATING ALIGNMENT PIN
S1, S2: SEATING DETECTION SENSOR
22: BASE
23: DRIVING DEVICE

13

231: CAM MEMBER
P: CAM GROOVE PORTION
PA: UPWARD PATH
PB: FORWARD/BACKWARD PATH
P1: FRONT CAM GROOVE PORTION
P2: REAR CAM GROOVE PORTION
232: CAM PROTRUSION
232-1: FRONT CAM PROTRUSION
232-2: REAR CAM PROTRUSION
C: CAM FOLLOWER
233: MOVING CARRIAGE
234: LIFTING PLATFORM
235: FIRST FORWARD-BACKWARD MOVING PLAT-
FORM
R1: FIRST RAIL
236: SECOND FORWARD-BACKWARD MOVING
PLATFORM
R2: SECOND RAIL
237: THIRD FORWARD-BACKWARD MOVING
PLATFORM
R3: THIRD RAIL
T1: FIRST POWER TRANSMISSION DEVICE
T1-1: (1-1)TH PULLEY
T1-2: (1-2)TH PULLEY
T1-3: (1-3)TH BELT
T2: SECOND POWER TRANSMISSION DEVICE
T2-1: (2-1)TH PULLEY
T2-2: (2-2)TH PULLEY
T2-3: (2-3)TH BELT
238: ELECTRIC ACTUATOR
L: LINK SHAFT
M: MOTOR
N: PISTON
24: FIXED PLATE
G: SEATING PLATE ACCOMMODATING GROOVE
PORTION
A4, A5: AUXILIARY ALIGNMENT PIN
S3, S4: STORAGE DETECTION SENSOR
241, 242, 243: PURGE PORT
244: DISCHARGE PORT
30: CONTROLLER
100, 200, 300: STOCKER SYSTEM HAVING ACTIVE
SHELF MODULE

What is claimed is:

1. A stocker system comprising:
a stocker body having at least one accommodation space
therein;
an active shelf module installed on the stocker body and
having at least a portion extended in a forward direction
or retracted in a reverse direction;
a controller configured to extend the active shelf module
to receive a carrier from the outside of the stocker body
and control the active shelf module to accommodate the
carrier in the at least one accommodation space inside
the stocker body;
a seating plate formed in a shape corresponding to the
carrier such that the carrier can be seated thereon;
a base installed on the stocker body; and
a driving device installed between the seating plate and
the base and configured to raise the seating plate in an
oblique direction or a vertical direction in the at least
one accommodation space and move the seating plate
forward and backward out of the stocker body,
wherein the driving device comprises:
a cam member installed on one side or both sides of the
base and having a cam groove portion extending from
an upward path to a forward/backward path; and

a cam protrusion guided along the cam groove portion of
the cam member.

2. The stocker system of claim 1, wherein the driving
device further comprises:
a moving carriage having the cam protrusion formed on
one side thereof and configured to rise along the
upward path along with the cam protrusion and move
forward and backward along the forward/backward
path; and
an electric actuator configured to receive a control signal
from the controller and raise and move the moving
carriage forward and backward.

3. The stocker system of claim 2,
wherein the electric actuator has a link shaft installed at
each of both ends to raise and move the moving
carriage forward and backward, has a piston extended
and retracted by a motor, and is installed obliquely as
a whole.

4. The stocker system of claim 2,
wherein the cam groove portion of the cam member
comprises a front cam groove portion and a rear cam
groove portion, which are formed in parallel so as to be
vertically spaced apart from each other so that the
moving carriage can maintain a horizontal state, and
the cam protrusion comprises a front cam protrusion
guided by the front cam groove portion and a rear cam
protrusion guided by the rear cam groove portion.

5. The stocker system of claim 2,
wherein the moving carriage comprises:
a lifting platform configured to rise together with the cam
protrusion in the oblique direction or the vertical direc-
tion along the upward path; and
a first forward-backward moving platform configured to
move forward and backward at a first stage in a
horizontal direction along a first rail installed on the
lifting platform.

6. The stocker system of claim 5,
wherein the moving carriage further comprises:
a second forward-backward moving platform configured
to move forward and backward at a second stage in the
horizontal direction along a second rail installed on the
first forward-backward moving platform when power is
transmitted by a first power transmission device as the
first forward-backward moving platform moves for-
ward by means of the electric actuator; and
a third forward-backward moving platform fixed to the
seating plate and configured to move forward and
backward at a third stage in the horizontal direction
along a third rail installed on the second forward-
backward moving platform when power is transmitted
by a second power transmission device as the second
forward-backward moving platform moves forward.

7. The stocker system of claim 6,
wherein the first power transmission device comprises:
a (1-1)th pulley rotatably installed on the first forward-
backward moving platform;
a (1-2)th pulley spaced apart from the (1-1)th pulley in a
forward or reverse direction and rotatably installed on
the first forward-backward moving platform; and
a (1-3)th belt which is wound around the (1-1)th pulley
and the (1-2)th pulley and rotated and has one side fixed
to the lifting platform and the other side fixed to the
second forward-backward moving platform so that
when the one side moves relatively forward, the other
side moves relatively backward, or when the one side
moves relatively backward, the other side moves rela-
tively forward.

15

8. The stocker system of claim 6,
wherein the second power transmission device comprises:
a (2-1)th pulley rotatably installed on the second forward-backward moving platform;
a (2-2)th pulley spaced apart from the (2-1)th pulley in a forward or reverse direction and rotatably installed on the second forward-backward moving platform; and
a (2-3)th belt which is wound around the (2-1)th pulley and the (2-2)th pulley and rotated and has one side fixed to the first forward-backward moving platform and the other side fixed to the third forward-backward moving platform so that when the one side moves relatively forward, the other side moves relatively backward, or when the one side moves relatively backward, the other side moves relatively forward.
9. The stocker system of claim 1,
wherein the seating plate has at least one seating alignment pin formed on an upper surface of the seating plate to correspond to an alignment groove of the carrier and at least one seating detection sensor installed to detect the seated carrier.
10. The stocker system of claim 1,
wherein the active shelf module further comprises a fixed plate installed on the stocker body and configured to support, along with the seating plate, the carrier accommodated in the at least one accommodation space.
11. The stocker system of claim 10,
wherein the fixed plate has a seating plate accommodating groove portion formed on an upper surface of the fixed plate to accommodate the seating plate; at least one auxiliary alignment pin formed to correspond to an alignment groove of the carrier and at least one storage detection sensor installed to detect the seated carrier.
12. The stocker system of claim 10,
wherein the fixed plate has at least one purge port docked with a purge hole of the carrier on an upper surface of the fixed plate to supply purge gas to the carrier and a discharge port configured to discharge the purge gas from the carrier.
13. The stocker system of claim 1,
wherein the stocker body comprises:
a fixed frame fixed to a ceiling of a building or a part of the building; and
at least one movable frame having the active shelf module installed thereon and configured to extend from the fixed frame or retract toward the fixed frame such that the at least one accommodation space is ensured when accommodating the carrier and a size of equipment is reduced as a whole by reducing the at least one accommodation space when the carrier is not accommodated.
14. The stocker system of claim 13,
wherein the stocker body further comprises a frame driving device installed on the fixed frame and extending or contracting the at least one movable frame.
15. The stocker system of claim 14,
wherein the frame driving device comprises:
a left lifting actuator installed on a left side of the fixed frame to raise and lower the left side of the at least one movable frame; and
a right lifting actuator installed on a right side of the fixed frame to raise and lower the right side of the at least one movable frame.
16. A control method of a stocker system comprising:
extending at least a portion of an active shelf module, which is installed inside a stocker body having at least one accommodation space formed therein, out of the stocker body;

seating a carrier, which is lowered by a carrier transfer device, on the active shelf module extended out of the stocker body; and
accommodating the carrier in the at least one accommodation space inside the stocker body by contracting the active shelf module,
wherein the extending of the at least the portion of the active shelf module comprises:
raising a seating plate in an oblique direction or a vertical direction along an upward path by interaction between a cam protrusion and a cam groove portion of a cam member, and
moving the seating plate forward and backward along a forward/backward path defined by the cam groove portion such that lifting and forward/backward movement of the seating plate are performed by a single driving device via the cam groove portion.
17. The control method of claim 16,
wherein, in operation (a), at least a portion of the active shelf module is raised in an oblique direction or a vertical direction using one electric actuator installed obliquely as a whole and an extension control signal is applied to the one electric actuator to cause the portion of the active shelf module to move forward to the outside of the stocker body, and
in operation (c), the portion of the active shelf module is retracted into the stocker body by using the one electric actuator and a retraction control signal is applied to the one electric actuator to cause the portion of the active shelf module to descend in the oblique direction or the vertical direction.
18. The control method of claim 17, further comprising:
after operation (c),
(d) withdrawing the carrier out of the stocker body by extending at least a portion of the active shelf module;
(e) raising and moving the withdrawn carrier to the carrier transfer device;
(f) retracting at least a portion of the active shelf module which is empty into the stocker body; and
(g) retracting a movable frame with respect to a fixed frame of the stocker body so as to reduce an empty accommodation space and allow space utilization.
19. A stocker system having an active shelf module, comprising:
a stocker body having at least one accommodation space therein;
an active shelf module installed on the stocker body and having at least a portion extended or retracted in a forward and reverse direction; and
a controller configured to extend the active shelf module to receive a carrier from the outside of the stocker body and control the active shelf module to accommodate the carrier in the at least one accommodation space inside the stocker body,
wherein:
the active shelf module comprises:
a seating plate formed in a shape corresponding to the carrier such that the carrier can be seated thereon;
a base installed on the stocker body; and
a driving device installed between the seating plate and the base and configured to raise the seating plate in an oblique direction or a vertical direction in the at least one accommodation space and move the seating plate forward and backward out of the stocker body,
the driving device comprises:

a cam member installed on one side or both sides of the base and having a cam groove portion extending from an upward path to a forward/backward path;

a cam protrusion guided along the cam groove portion of the cam member;

a moving carriage having the cam protrusion formed on one side thereof and configured to rise along the upward path along with the cam protrusion and move forward and backward along the forward/backward path; and an electric actuator configured to receive a control signal from the controller and raise and move the moving carriage forward and backward, the moving carriage comprises:

a lifting platform configured to rise together with the cam protrusion in the oblique direction or the vertical direction along the upward path;

a first forward-backward moving platform configured to move forward and backward at a first stage in a horizontal direction along a first rail installed on the lifting platform;

a second forward-backward moving platform configured to move forward and backward at a second stage in the horizontal direction along a second rail installed on the first forward-backward moving platform when power is transmitted by a first power transmission device as the first forward-backward moving platform moves forward by means of the electric actuator; and a third forward-backward moving platform fixed to the seating plate and configured to move forward and backward at a third stage in the horizontal direction along a third rail installed on the second forward-backward moving platform when power is transmitted by a second power transmission device as the second forward-backward moving platform moves forward, the first power transmission device comprises:

a (1-1)th pulley rotatably installed on the first forward-backward moving platform;

a (1-2)th pulley spaced apart from the (1-1)th pulley in a forward or reverse direction and rotatably installed on the first forward-backward moving platform; and a (1-3)th belt which is wound around the (1-1)th pulley and the (1-2)th pulley and rotated and has one side fixed to the lifting platform and the other side fixed to the second forward-backward moving platform so that when the one side moves relatively forward, the other side moves relatively backward, or when the one side moves relatively backward, the other side moves relatively forward, and the second power transmission device comprises:

a (2-1)th pulley rotatably installed on the second forward-backward moving platform;

a (2-2)th pulley spaced apart from the (2-1)th pulley in a forward or reverse direction and rotatably installed on the second forward-backward moving platform; and a (2-3)th belt which is wound around the (2-1)th pulley and the (2-2)th pulley and rotated and has one side fixed to the first forward-backward moving platform and the other side fixed to the third forward-backward moving platform so that when the one side moves relatively forward, the other side moves relatively backward, or when the one side moves relatively backward, the other side moves relatively forward.

\*  \*  \*  \*  \*